United States Patent [19]

Howell

[11] Patent Number: 4,638,244

[45] Date of Patent: Jan. 20, 1987

[54] GROUND CONNECTION MONITOR

[75] Inventor: Edward K. Howell, Simsbury, Conn.

[73] Assignee: General Electric Company, New York, N.Y.

[21] Appl. No.: 663,644

[22] Filed: Oct. 22, 1984

[51] Int. Cl.[4] .......................................... G01R 31/02
[52] U.S. Cl. ..................................................... 324/51
[58] Field of Search ...................... 324/52, 51; 361/80, 361/82, 42

[56] References Cited

U.S. PATENT DOCUMENTS

| | | | |
|---|---|---|---|
| 3,670,240 | 6/1972 | Maranchak et al. | 324/52 |
| 3,671,856 | 6/1972 | Shalyt et al. | |
| 3,710,240 | 1/1973 | Kuehnemann et al. | |
| 3,753,086 | 8/1973 | Shoemaker, Jr. | 324/52 |
| 3,895,264 | 7/1975 | Kirilloff | |
| 3,909,712 | 9/1975 | Rietz et al. | |
| 3,911,358 | 10/1975 | Shalyt et al. | |
| 3,934,176 | 1/1976 | Vasudevan et al. | |
| 3,995,200 | 11/1976 | Stolarczyk | |
| 4,023,154 | 5/1977 | Comeaux | 324/52 |
| 4,041,381 | 8/1977 | Hwa | |
| 4,075,675 | 2/1978 | Burkett et al. | |
| 4,104,582 | 8/1978 | Lambertsen | 324/52 |

Primary Examiner—Stanley T. Krawczewicz
Attorney, Agent, or Firm—Richard A. Menelly; Walter C. Bernkopf; Fred Jacob

[57] ABSTRACT

A circuit is employed to determine the presence of an open ground connection between a power source and a movable machine connected with the power source by means of a flexible cable. The circuit comprises a pulse generator for transmission of a pulse along the cable between the power source and the movable machine in combination with comparison means for determining whether the reflected pulse back along the cable from the movable machine becomes inverted upon reflection. The presence of a non-inverted reflected pulse indicates an open ground connection. Means are provided for disconnection of power between the power source and the movable machine upon the absence of receipt of an inverted reflected pulse along the connecting cable.

13 Claims, 5 Drawing Figures

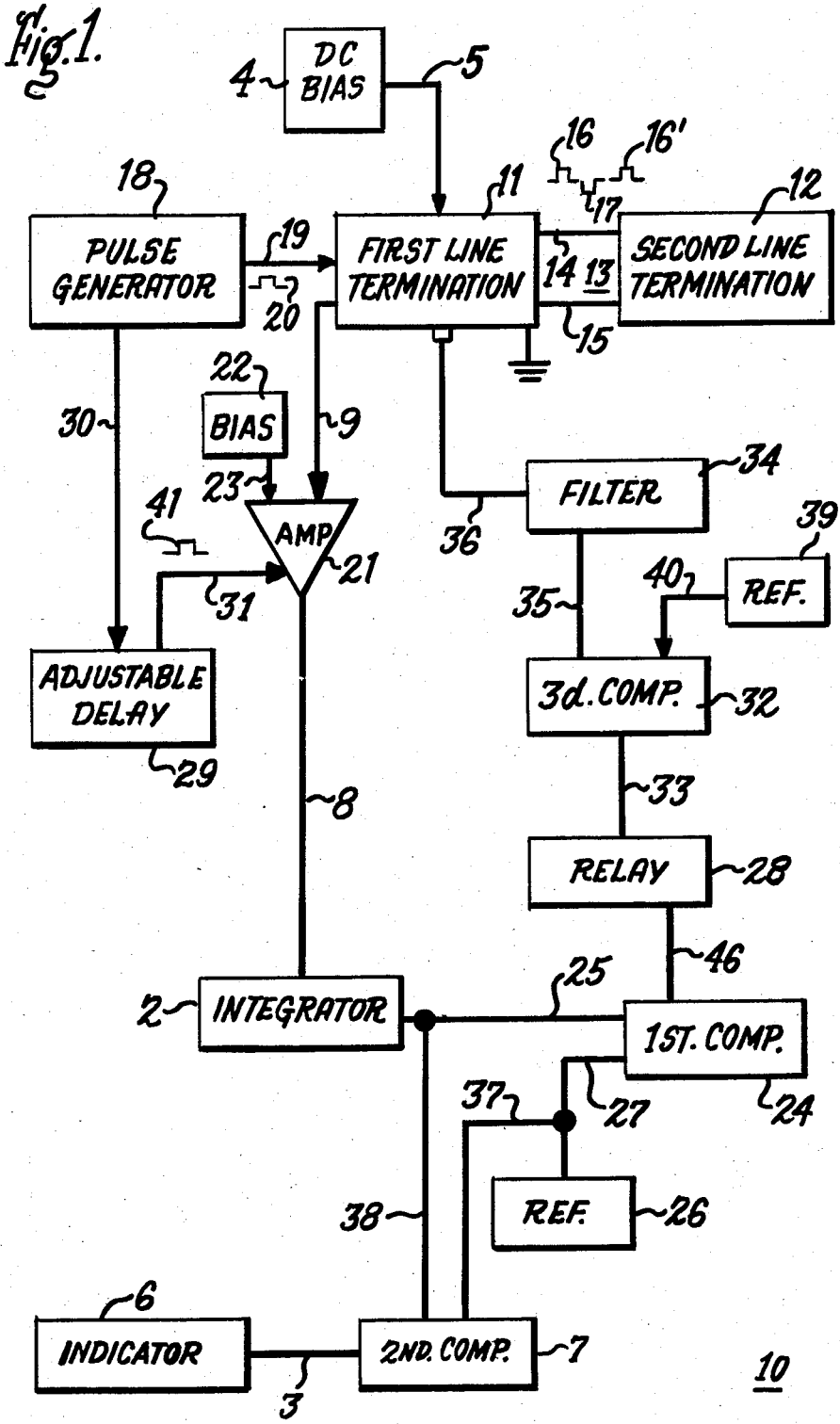

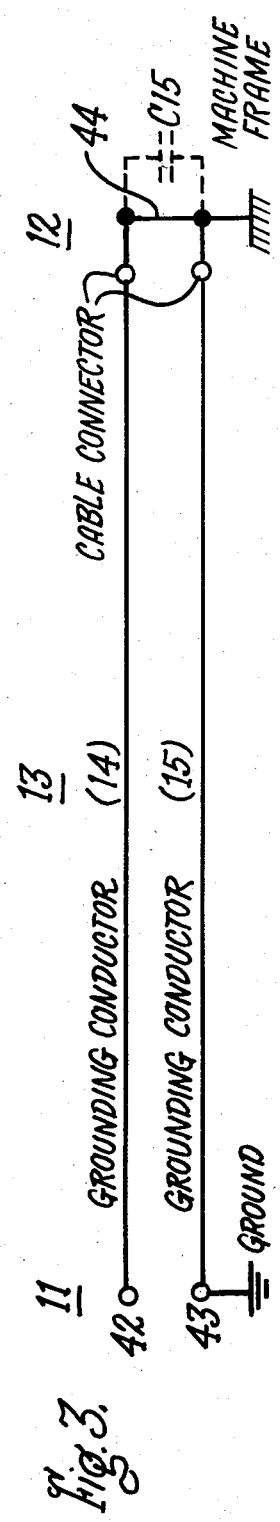
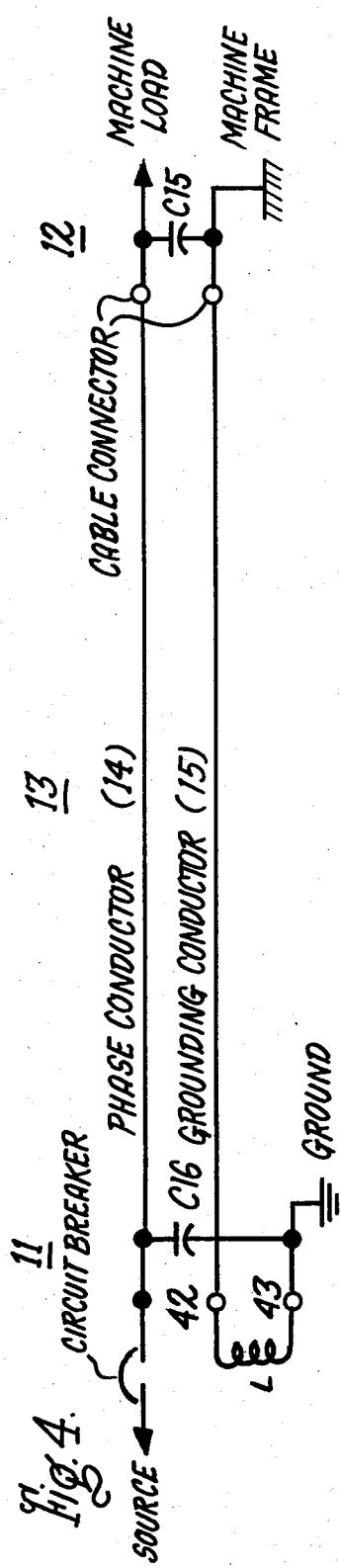
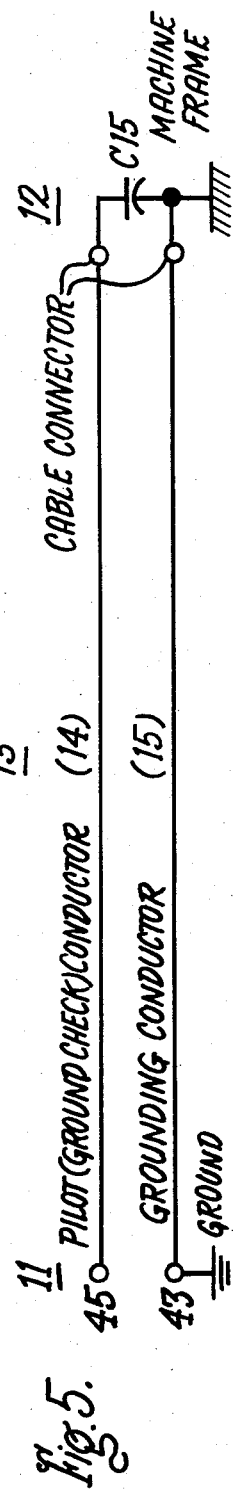

GROUND CONNECTION MONITOR

BACKGROUND OF THE INVENTION

The invention relates in general to means for determining an open circuit and, in particular, to determining an open ground connection existing between a power source and a movable machine connected with the power source by means of a flexible cable.

Current methods for providing ground fault and open ground cable connections are disclosed within U.S. Pat. Nos. 3,671,856; 3,710,240; 3,895,264; 3,909,712; 3,911,358; 3,934,176; 3,938,006; 3,995,200, 4,041,381 and 4,075,675. The aforementioned patents disclose complex electronic circuitry and, in some cases, require three-phase conductors which include at least one ground conductor.

One currently employed power connecting cable utilizes three equal-sized phase conductors and three equal-sized ground conductors. Another power connecting cable contains two equal-sized ground conductors and a smaller diameter pilot wire conductor along with the three equal-sized phase conductors.

The ground connection monitor of the invention operates with both types of connecting cables for both determining the presence of an open ground connection as well as for determining the location of the open connection along the cable extent.

SUMMARY OF THE INVENTION

The invention comprises means for determining the presence of an open ground connection in a cable between a power source and a movable machine. A pulse of one polarity is transmitted down a pair of conductors, one of which is a grounding conductor, extending between the power source and the movable machine. The conductors are normally terminated at the machine with a high frequency short circuit such that pulse polarity is inverted upon reflection from the termination. The time between pulse transmission and receipt of the reflected pulse is a definite function of cable length. At a predetermined time delay after pulse transmission, corresponding to the known attached cable length, a circuit is enabled for the duration of a pulse width, and the received signal is examined for a reflected pulse having inverted polarity. Inverted pulses found at this time cause a relay to be energized, indicative of cable continuity. Non-inverted reflected pulses indicating an open ground conductor, or inverted pulses received before the pre-determined time delay, indicating a short in the cable, or missing pulses, de-energize the relay to immediately open the circuit between the power supply and the movable machine. An adjustable delay can be used to determine the time delay existing between the transmission of a pulse and receipt of the reflected pulse, and allow the location of the open circuit or short circuit along the cable to be determined.

BRIEF DESCRIPTION OF THE DRAWINGS

FIG. 1 is a block circuit diagram of the ground connection monitor according to the invention;

FIG. 2 is a detailed representation of the circuit elements used within the block diagrams depicted in FIG. 1;

FIG. 3 is a circuit diagram of a first connection arrangement for the ground connection monitor of the invention;

FIG. 4 is circuit diagram of a second connection arrangement for the ground connection monitor of the invention; and FIG. 5 is a circuit diagram of a third connection arrangement for the ground connection monitor of the invention.

DESCRIPTION OF THE PREFERRED EMBODIMENT

Figure 12:
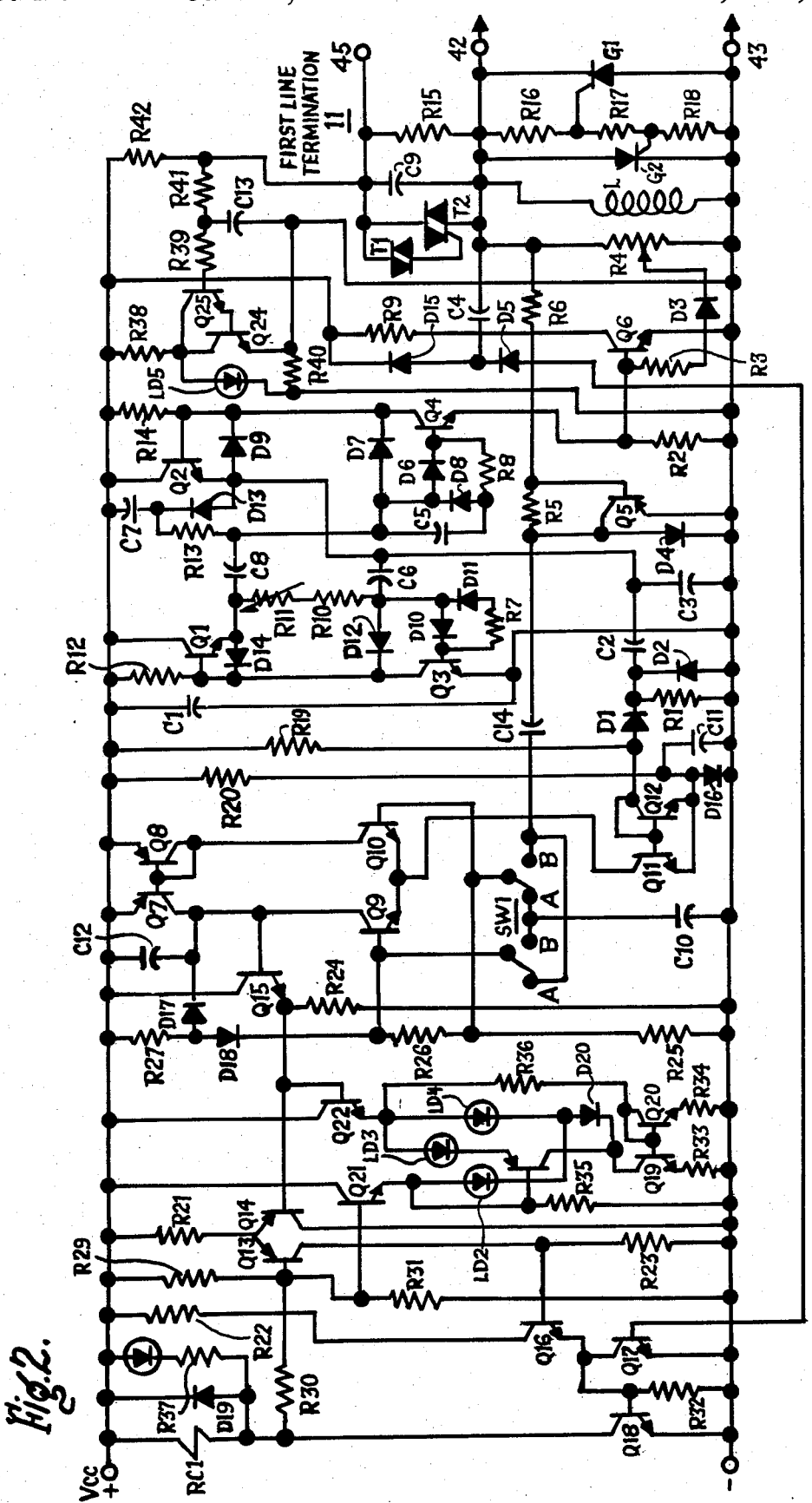

FIG. 1 contains a circuit 10 for monitoring the continuity of a pair of conductors in a multiconductor cable. The circuit is particularly useful in an application wherein the continuity of a particular conductor is important such as when comprising the grounding conductor in a cable 13 extending between a power source and a movable machine such as a mining machine. Circuit 10 operates in the following manner. Cable 13 is connected at the power source with a first line termination 11 having an impedance approximately equal to the characteristic impedance of cable 13, and is connected at the mining machine with a second line termination 12 having an impedance much lower than the characteristic impedance of cable 13. Two types of cables are generally employed with mining machinery. The first type contains a pair of single phase conductors and a ground conductor of the same diameter or three phase conductors and three ground conductors of equal diameter. The second type of cable contains a pair of single phase conductors and a ground conductor of the same diameter along with a pilot conductor of smaller diameter or three equal diameter phase conductors, two ground conductors of the same diameter and a smaller diameter pilot conductor. Circuit 10 can be used to monitor the continuity of the phase conductors, ground conductors or pilot conductor depending on the particular application. In the circuit shown in FIG. 1, for example, conductor 14 can be one of the phase conductors within cable 13 and conductor 15 can be the ground conductor. The circuit of FIG. 1 can also be used to determine the location of a discontinuity in the form of either an open circuit or a short circuit occurring along a pair of conductors 14 and 15. Cable 13 contains at least two such electrical conductors 14, 15 for transmission of a pulse 16 having the indicated wave-form and for receiving a reflected pulse 17 which is inverted with respect to pulse 16 as shown. Pulse generator 18 is used to repetitively shape and transmit a pulse such as 20, having the indicated wave-form along conductor 19 to first line termination 11 for transmission of pulse 16 along conductor pair 14, 15 to second line termination 12. When transmitted pulse 16 reaches second line termination 12, it is inverted and reflected, as if second line termination 12 were a short circuit, back along conductor pair 14, 15 having the configuration of reflected pulse 17. As long as conductors 14 and 15 are continuous, that is, not having any discontinuities such as would exist with an open circuit, pulse 16 becomes inverted upon reflection and returns to first line termination 11 in a time that is proportional to the total length of the cable 13. In the event that either conductor 14 or 15 is open circuited, transmitted pulse 16 reflects from the open circuit having the non-inverted configuration depicted at 16' and returns to first line termination 11 in a time proportional to the length of that portion of cable 13 between termination 11 and the point of the open circuit.

In the event that conductors 14 and 15 become shorted together, the reflected pulse would be inverted, similar to wave-form 17, and would return to first line termination 11 in a time proportional to the length of that portion of cable 13 between first line termination 11 and the point of the short circuit. The inverted reflected pulses from first line termination 11 are connected to a gated amplifier 21 by means of conductor 9 and are compared with the DC voltage provided at bias circuit 22 which is connected to gated amplifier 21 by means of conductor 23. The transit time determination is provided by means of an adjustable time delay circuit 29 connected with the pulse generator 18 by means of conductor 30. The output of the adjustable time delay circuit 29 is connected to the gate of gated amplifier 21 by means of conductor 31 to provide a gating pulse 41 at the time that the inverted pulse 17 normally returns from second line termination 12 to first line termination 11. The output of gated amplifier 21 is connected to an integrator 2 by means of conductor 8 for averaging a plurality of output pulses from gated amplifier 21 and from integrator 2 to a first comparator 24 by means of conductor 25 for comparing the average output pulse to a DC reference value supplied from reference 26 over line 27. The output of first comparator 24 is connected with a relay 28 by means of conductor 46 for operating relay 28 to interrupt power from the power source upon the absence of inverted reflected pulses such as 17 occuring at the time the gated amplifier 21 is activated, or when the average output pulse value is less than the DC reference. A second comparator 7 is connected with integrator 2 by means of conductor 38 and with reference 26 by means of conductor 37 for providing a signal voltage to an indicator unit 6 which is connected with the second comparator 7 by means of conductor 3. Indicator 6 contains a plurality of light sources which are colorcoded to indicate the relative amplitude of the reflected pulse 17 to allow adjustment of the sensitivity of the circuit. The functional relationship between second comparator 7, reference 26 and indicator 6 will be discussed below in greater detail. A third comparator 32 is connected to first line termination 11 through conductor 35, filter 34 and conductor 36. The purpose of the third comparator is to monitor the level of a DC voltage, obtained from a DC bias source 4 through conductor 5 to first line termination 11, along either conductor 14 or 15 and comparing the DC voltage level with a reference voltage level supplied to the third comparator by means of reference 39 and conductor 40. The output of the third comparator is connected with relay 28 by means of connector 33 and provides a signal to relay 28 when the input DC voltage level exceeds that of the reference voltage thereby causing relay 28 to disconnect the electric power. The third comparator 32 is required when the cable 13 is of the second type, describer earlier, which contains a small diameter pilot conductor. The components of the ground connection circuit 10 shown generally in FIG. 1 are detailed within the circuit 10 of FIG. 2 as follows.

Pulse generator 18 and adjustable time delay 29 comprise the subcircuit combination of resistors $R_1$–$R_{14}$, diodes $D_1$–$D_{15}$, along with the transistors $Q_1$–$Q_6$ and capacitors $C_1$–$C_8$. Gated amplifier 21 comprises the subcircuit combination of a pair of transistors $Q_7$, $Q_8$, second pair of transistors $Q_9$, $Q_{10}$, third pair of transistors $Q_{11}$, $Q_{12}$, transistor $Q_{15}$, double pole switch SW1, capacitors $C_{10}$, $C_{11}$, $C_{14}$, diodes $D_{16}$, $D_{17}$, $D_{18}$ and resistors $R_{19}$ and $R_{24}$. First comparator 24 consists of resistors $R_{21}$–$R_{23}$, and transistors $Q_{13}$, $Q_{14}$, $Q_{16}$. Bias circuit 22 for gated amplifier 21 consists of resistors $R_{25}$–$R_{27}$ and diode $D_{18}$. Reference voltage for first comparator 24 and second comparator 7 is provided by means of reference circuit 26 containing resistors $R_{29}$–$R_{31}$. DC bias for first line termination 11 is provided by the DC bias subcircuit 4 consisting of resistor $R_{42}$.

First line termination 11 comprises a diac $T_1$ and a triac $T_2$, capacitor $C_9$, inductor L, thyristors $G_1$ and $G_2$, resistors $R_{15}$–$R_{18}$, and terminals 42, 43, 45. Integrator circuit 2 is provided by means of capacitor $C_{12}$. Relay circuit 28 consists of resistors $R_{32}$ and $R_{37}$, transistor $Q_{18}$, diode $D_{19}$, relay coil $RC_1$, and light emitting dioe $LD_1$. Second comparator circuit 7 comcomprises resistors $R_{33}$–$R_{36}$, transistors $Q_{19}$–$Q_{23}$, diode $D_{20}$, and indicator circuit 6 comprising light emitting diodes $LD_2$–$LD_4$. Third comparator circuit 32 consists of resistors $R_{38}$–$R_{40}$, transistor pair $Q_{24}$, $Q_{25}$, transistor $Q_{17}$ and light emitting diode $LD_5$. Filter circuit 34 is provided by means of resistor $R_{41}$ and capacitor $C_{13}$. Reference voltage 39 is provided by the characteristics of transistors $Q_{24}$ and $Q_{25}$.

The second line termination 12 is shown in FIG. 3, connected with the first line termination terminal 42 by means of conductor 14 and with the first line termination terminal 43 by means of conductor 15. A direct electrical connection 44 can be made between conductors 14 and 15 or a capacitor $C_{15}$ can be connected between the conductors to complete the circuit. The first line termination terminal 43 is electrically connected with ground, as indicated. As described earlier with reference to FIG. 1, reflected pulses from the second line termination 12 transmit back along the conductors 14 and 15 through first line termination 11 to the gated amplifier 21 over conductor 9. With switch SW1 in position A, gated amplifier 21 only amplifies the reflected pulse when the polarity of the reflected pulse is similar to that shown at 17 which is inverted with respect to the transmitted pulse 16 and occurs at the same time amplifier 21 is gated by the adjustable delay pulse 41 according to setting of pot R11. Indication of the absence of an open or a short circuit along conductors 14, 15 is made by the illumination of the light emitting diode $LD_1$ shown in FIG. 2. Once the average reflected pulse value from the integrator 2 in FIG. 1 is compared with reference voltage provided by reference 26 within first comparator 24 and a signal is provided to relay 28, light emitting diode $LD_1$ also operates to show the relay coil in $RC_1$ has become energized. Comparing the average reflected pulse value obtained from integrator 2 within the second comparator 7 with a reference voltage provided by reference 26, produces the following results. When the average reflected pulse value is equal to that of the reference voltage, light emitting diode $LD_4$ in FIG. 2 becomes illuminated and emits a green light to indicate that the reflected pulse has the proper amplitude for optimum circuit performance. When the average reflected pulse value is greater than the reference voltage, light emitting diode $LD_3$ becomes illuminated and emits an amber light indicating that the amplitude of the reflected pulse is too large. When the average reflected pulse value is less than the reference voltage, light emitting diode $LD_2$ becomes illuminated to provide a red light thus indicating that the amplitude of the reflected pulse is too low. Potentiometer $R_4$ permits adjustment of the transmitted pulse amplitude to obtain the proper reflected pulse amplitude as indicated by illumination of the light emitting diode $LD_4$.

When circuit 10 is used with a cable having one or more phase conductors 14 and one or more grounding conductors 15, as shown in FIG. 4, at least one of the phase conductors is connected with ground by means of a capacitor $C_{16}$ and the grounding conductor 15 is connected to first line termination terminal 42. The machine end of the phase conductor 14 is connected to grounding conductor 15 by capacitor $C_{15}$ which is the second line termination 12. When second line termination 12 is used with mobile mine machinery, the grounding conductor connection is made with the machinery frame as indicated.

When circuit 10 is used with a cable employing three phase conductors of equal size and two equal-size grounding conductors with a smaller pilot wire conductor shown in FIG. 5, the two larger grounding conductors 15 are connected with ground and terminal 43 of first line termination 11 and are connected with the machine frame at second line termination 12. Connection is made with terminal 45 on first line termination 11 with the pilot wire conductor 14. The machine end of the pilot wire conductor 14 is connected to grounding conductor 15 and the machine frame through a capacitor $C_{15}$ which is second line terminal 12.

To determine the integrity of the pilot wire conductor 14, a DC voltage is applied along the pilot wire conductor and is connected through filter 34 as shown in FIG. 1 to an input of the third comparator 32 for comparison with a reference voltage provided by reference 39. In the event that a short circuit occurs between the pilot wire conductor V and a grounding conductor, the voltage received at third comparator 32 is lower than the reference voltage and causes an output to occur from the third comparator to de-energize relay 28. Upon de-energizing relay coil $RC_1$ as shown in FIG. 2, light emitting diode $LD_1$ ceases to be illuminated to indicate that the relay is de-energized. Further, light emitting diode $LD_5$ becomes illuminated to give an indication of the presence of a short circuit occurring along the pilot wire conductor.

Although the circuit of the instant invention is described particularly for use with determining an open circuit or a fault along the cable connecting mobile mining equipment with a power source, this is by way of example only. The circuit of this invention finds application wherever two electrical conductors are to be monitored for purposes of determining the occurrence of a short circuit or an open circuit, and for determining the location of the short circuit or open circuit. The location of the fault can be determined by adjusting the gating time of gated amplifier 21 and selecting the appropriate polarity of the reflected received pulse by moving SW1 to A or B contacts until the integrator 2 indicates a received signal. Switch SW1 in the A position permits receiving the inverted polarity pulses reflected from a short circuit, and in the B position permits receiving non-inverted pulses reflected from an open circuit. The relationship between cable length and pulse transit time allows the approximate location of the open circuit or short circuit to be readily determined.

Having described my invention, what I claim as new and desire to secure by Letters Patent is:

1. Apparatus for monitoring the continuity of a pair of conductors in a multiconductor cable comprising:
    pulse generating means for transmitting a pulse of a first polarity from a first line termination at one end of said conductors along said pair of conductors;
    means for receiving said pulse upon reflection from a second line termination at an opposite end of said conductors and for comparing the polarity of said received pulse relative to said transmitted pulse;
    means connected with said comparison means for providing a response in accordance with said comparison;
    said means connected with said comparison means providing said response when said reflected pulse arrives at said receiving means with a predetermined polarity and at a predetermined time after said transmitted pulse; and
    said receiving means including an amplifier connected at one of its inputs to said first line termination and at another of its inputs to a DC reference for amplifying said received pulse when said received pulse is of a predetermined polarity.

2. The apparatus of claim 1 wherein said response means includes an integrator for averaging a plurality of said received pulses and a first comparator connected with said integrator for comparing said average received pulse to a reference and for providing a signal to operate a relay in response to said comparison.

3. The apparatus of claim 2 further including a second comparator connected with said integrator, and a first, second and third indicator connected with said reference for comparing said average received pulse to a reference voltage and indicating the level of said average received pulse.

4. The apparatus of claim 2 further including a light source connected with said first comparator to provide an indication of the operation of said third comparator.

5. The apparatus of claim 8 wherein said second line termination comprises a capacitor connected between said pair of conductors or a direct connection between said pair of conductors at an opposite end.

6. The apparatus of claim 3 further including a source of DC potential and a filter connected with a third comparator and one of said conductors for comparing the level of a DC voltage along said conductor with a reference voltage.

7. The apparatus of claim 3 wherein said first indicator is operated when said average received pulse is at a first level of voltage, said second indicator is operated when said average received pulse is at second level of voltage, and said third indicator is operated when said average received pulse is at a third level of voltage.

8. The apparatus of claim 7 including means for controlling the voltage level of said transmitted pulse.

9. Apparatus for monitoring the continuity of a pair of conductors in a multiconductor cable comprising:
    pulse generating means for transmitting a pulse of a first polarity from a first line termination at one end of said conductors along said pair of conductors;
    means for receiving said pulse upon reflection from a second line termination at an opposite end of said conductors; and
    means including a gated amplifier connected at one of its inputs to said first line termination, and adjustable time delay means connected with said pulse generator for enabling said gated amplifier to amplify said received pulse only when the time delay between said transmitted and said received pulse corresponds to a propagation time characterized by length of said multiconductor cable.

10. The apparatus of claim 9 wherein said first line termination comprises an impedance connected between said pair of conductors at said one end.

11. The apparatus of claim 9 wherein said multiconductor cable includes at least one grounded conductor and at least one power carrying conductor for connection between a power source and a movable machine.

12. The apparatus of claim 11 wherein said multiconductor cable connecting between said movable machine and said power supply includes three separate phase power conductors and three separate grounding conductors.

13. The apparatus of claim 12 wherein one of said grounding conductors has a smaller diameter than the other two grounding conductors.

* * * * *